(12) United States Patent
Galle et al.

(10) Patent No.: US 12,635,115 B2
(45) Date of Patent: May 19, 2026

(54) ELECTRICAL WORK MACHINE HAVING A COOLED BATTERY

(71) Applicant: Wacker Neuson Produktion GmbH & Co. KG, Reichertshofen (DE)

(72) Inventors: Steffen Galle, Landshut (DE); Matthias Bachmann, Neuburg (DE); Alto Weiskopf, Altomünster (DE); Robert Hartmann, Munich (DE); Florian Forstner, Rudelzhausen (DE); Markus Kollmann, Alkoven (AT)

(73) Assignee: Wacker Neuson Produktion GmbH & Co., Reichertshofen (DE)

( * ) Notice: Subject to any disclaimer, the term of this patent is extended or adjusted under 35 U.S.C. 154(b) by 708 days.

(21) Appl. No.: 17/976,017

(22) Filed: Oct. 28, 2022

(65) Prior Publication Data

US 2023/0138832 A1 May 4, 2023

(30) Foreign Application Priority Data

Oct. 29, 2021 (DE) .......................... 10 2021 128 350
May 25, 2022 (EP) ...................................... 22175425

(51) Int. Cl.
E01C 19/35 (2006.01)
H01M 10/613 (2014.01)
H05K 7/20 (2006.01)

(52) U.S. Cl.
CPC ......... H05K 7/20909 (2013.01); E01C 19/35 (2013.01); H01M 10/613 (2015.04); H05K 7/20145 (2013.01)

(58) Field of Classification Search
CPC .......... H05K 7/20909; H05K 7/20145; H01M 10/613; E01C 19/35

USPC ......................................... 404/133.05–133.2
See application file for complete search history.

(56) References Cited

U.S. PATENT DOCUMENTS

| | | | |
|---|---|---|---|
| 7,682,102 B1 * | 3/2010 | Burke | E01C 19/35 |
| | | | 404/133.05 |
| 2010/0155162 A1 * | 6/2010 | Nakamura | H01M 10/633 |
| | | | 318/473 |
| 2013/0251452 A1 * | 9/2013 | Steffen | E02D 3/074 |
| | | | 404/133.05 |

(Continued)

FOREIGN PATENT DOCUMENTS

| | | | | |
|---|---|---|---|---|
| DE | 102009004443 A1 | 7/2010 | | |
| DE | 102009017209 B4 * | 5/2011 | | E02D 3/046 |

(Continued)

*Primary Examiner* — Raymond W Addie
(74) *Attorney, Agent, or Firm* — Boyle Fredrickson, S.C.

(57) ABSTRACT

A work machine, such as a vibration tamper or a vibratory plate machine, includes a work device such as a ground contact plate, and a drive for driving the work device. The drive has an electric drive motor, an electric power accumulator for supplying the drive motor with an electric current, and an inverter installation for inverting the current from the power accumulator and for supplying the current to the drive motor. A cooling device is provided for cooling the power accumulator and the inverter installation. The cooling device has at least one fan installation for generating a cooling airflow which is able to be guided by way of the power accumulator and the inverter installation. The fan installation has a fan and a fan motor that drives the fan. The fan motor is provided separately from the drive motor of the drive.

15 Claims, 3 Drawing Sheets

(56)                    References Cited

U.S. PATENT DOCUMENTS

2015/0255838 A1 *  9/2015  Inoue .................. H01M 10/625
                                                                429/62

FOREIGN PATENT DOCUMENTS

| | | |
|---|---|---|
| DE | 10 2010 055 632 | 6/2012 |
| DE | 10 2011 104 269 | 12/2012 |
| DE | 10 2011 115 008 | 4/2013 |
| DE | 10 2020 102 949 | 8/2021 |
| EP | 2584100 A1 | 4/2013 |
| EP | 2857587 A1 | 4/2015 |

* cited by examiner

ELECTRICAL WORK MACHINE HAVING A COOLED BATTERY

BACKGROUND OF THE INVENTION

1. Field of the Invention

The invention relates to a work machine, in particular a storage battery-operated construction machine having an electric drive.

2. Description of the Related Art

Storage battery-operated construction machines have a powertrain having an electric motor, a power accumulator (storage battery) and an inverter. The inverter converts the current from the power accumulator (usually DC) into a current suitable for supplying to the electric motor, for example AC. The components have to be efficiently cooled in order for the construction machine to be able to reliably operate. This applies in particular to the storage battery, the cells of the latter potentially being permanently damaged in the event of excessive heat acting thereon, this potentially reducing not only the storage capability but also the service life of the storage battery.

For cooling the storage battery and the inverter it is known to provide a fan wheel on the electric motor of the construction machine that serves as the drive motor, said fan wheel generating an airflow. The airflow in this instance can be guided not only by way of the drive motor but also by way of the storage battery and the inverter so as to effect suitable cooling during the operation of the construction machine.

Depending on the type of the construction machine, it is possible for the storage battery and the inverter to be disposed at some distance from the electric motor. In this case it is necessary for the cooling airflow to be directed by way of cooling ducts (air-guiding ducts) in order for the cooling airflow, which is generated at the drive motor by the fan present on the latter, to act also on the storage battery and the inverter. Depending on the length and the design of the air-guiding ducts, the cooling effect on the storage battery and on the inverter may be only minor.

The cooling effect is achieved only during the operation of the drive motor, because the fan wheel is also driven only then. Therefore, in other operating situations there is the risk of excessive heat acting on the storage battery or the inverter when the drive motor is not in operation and thus no cooling airflow is being generated.

SUMMARY OF THE INVENTION

The invention is based on the object of specifying a work machine having improved cooling for the storage battery and the inverter.

The object is achieved by a work machine having a work device for effecting an operative movement and a drive for driving the work device. The drive has an electric drive motor, an electric power accumulator for supplying the drive motor with an electric current, and an inverter installation for inverting the current from the power accumulator and for feeding the current to the drive motor. A cooling device is provided for cooling the power accumulator and the inverter installation. The cooling device has at least one fan installation for generating a cooling airflow for cooling the power accumulator and the inverter installation. The fan installation has a fan and a fan motor that drives the fan. The fan motor is provided separately from the drive motor of the drive.

The work machine can be, for example, a vibrating tamper or a vibratory plate compactor for compacting ground. Accordingly, the operative movement can be a tamping movement or a vibratory movement which in a suitable manner known per se is introduced into the ground, for example. Other construction machines can also be used as work machines of this type.

The power accumulator can be a storage battery or a rechargeable battery, respectively, of a construction mode known per se.

The inverter installation can be, for example, a frequency inverter which is suitable for converting the voltage and the frequency of the current supplied from the power accumulator into a current which is suitable for the operation of the electric drive motor (electric motor).

The fan can be configured as a ventilator or propeller, or any other installation, which is driven by the fan motor in order for the desired cooling airflow to be generated.

The fan motor per se can likewise be an electric motor. Said fan motor is provided additionally to the drive motor and can be disposed on the work machine in the proximity of the drive motor, or else at a distance from the latter.

Suitable air-guiding ducts such as hoses, pipes or else suitably designed housing elements can be provided for guiding the cooling airflow.

It is important here that the cooling airflow can be guided by way of the power accumulator and the inverter installation. In particular, the cooling airflow should be guided in a path extending along the external walls of the power accumulator and of the inverter installation, thus along the housing. It is, however, likewise possible that the cooling airflow is guided through the respective housings so as to reach the heat-containing components in the best possible manner in order for effective cooling to be able to be achieved.

It is possible for a plurality of fan installations having a plurality of fans and/or fan motors to be provided, in order to provide a flexible cooling concept. The cooling device can suitably avail of the plurality of fans in this instance, and also individually actuate the fans, for example.

An electrical supply of the fan motor, or of the optionally plurality of fan motors, respectively, can take place with the aid of the power from the electric power accumulator.

Depending on the design of the work machine, it is possible that no cooling is provided for the actual drive motor but that the cooling is performed solely for the components power accumulator and inverter installation. The cooling of the drive motor in this instance may be possible intrinsically, by convection or radiation.

The cooling airflow can be guided in a path extending between the power accumulator and the inverter installation. Depending on the design, it is possible for the cooling airflow here to be guided in both directions, thus either initially by way of the power accumulator, and then downstream from the power accumulator by way of the inverter installation, or in the opposite direction. Since the power accumulator comprises the often highly heat-sensitive cells of the battery, it can be expedient for the cooling air inducted from the environment first to be guided by way of the power accumulator and only thereafter, when said cooling air has already absorbed the heat of the power accumulator, to be guided by way of the inverter.

The fan can be disposed in the cooling airflow path between the power accumulator and the inverter installation.

The fan serves for generating the cooling airflow and, depending on the direction of flow, causes a suction effect or a blower effect (forcing the cooling air in the downstream direction). The disposal of the fan between the power accumulator and the inverter installation enables a particularly compact construction. At the same time, it is possible for the fan to be embodied so as to be relatively small, because both fluidic sides (upstream and downstream of the fan) are utilized for generating the cooling airflow and for cooling the respective components disposed there.

An air control installation for actuating the fan motor can be provided. The air control installation can in particular actuate the fan motor independently of the actual drive motor of the work machine. The control permits in particular that the fan motor is switched on and off dependent on the temperature, thus not switching the fan motor in an operation-dependent manner as a function of the drive motor being switched on and off.

As the relevant temperature, the air control installation can take into account for example the ambient temperature, at or in the inverter and/or at or in the power accumulator. It is also possible for the fan rotating speed to be feedback-controlled as a function of the temperature, so as to avoid any unnecessarily intense operation of the cooling device and thus also any unnecessary power consumption.

Customized cooling of the power accumulator and of the inverter installation can be achieved in this way. As a result, premature cell aging in the power accumulator can be avoided, as a result of which the capacity of the cells in terms of power and output can be increased.

The required current supply of the air control installation as well as of the fan installation can likewise be provided by way of the power accumulator and optionally also by way of the inverter installation.

In one embodiment of the work machine, an upper mass and a lower mass can be provided, wherein the lower mass is movable relative to the upper mass, wherein the power accumulator, the inverter installation and the cooling device are disposed on the upper mass, and wherein a ground contact plate for carrying out the operative movement can be provided on the lower mass.

This work machine can be embodied as, for example, a vibrating tamper or as a vibratory plate or vibratory plate compactor. Accordingly, the work device can act between the upper mass and the lower mass and be configured, for example, as a tamping device or as a vibration exciter. A spring installation, or a spring-damper installation, respectively, can be provided between the upper mass and the lower mass so as to achieve vibration decoupling between the upper mass and the lower mass and enable the relative mobility therebetween.

The drive motor can be disposed on the upper mass or on the lower mass, depending on the embodiment. In the case of a vibrating tamper, it will be expedient for the drive motor to be disposed on the upper mass, and for the drive movement of the drive motor to be transmitted to the lower mass having the ground contact plate by way of a tamping device that serves as a work device.

This principle can also be implemented in a vibratory plate compactor in which the drive movement of the drive motor on the upper mass then has to be transmitted to the vibration exciter on the lower mass.

In one variant, the drive motor can also be attached directly to the lower mass, for example be attached directly to the ground contact plate and thereon be coupled to a vibration exciter.

The upper mass can have a gripping installation for guiding the work machine by a user, wherein the power accumulator and the fan installation can be disposed on the gripping installation. In this embodiment, the work machine can be configured as a vibrating tamper, for example. The gripping installation, for example a handlebar known per se, can be decoupled from the remaining part of the upper mass by way of a vibration-decoupling installation so as to protect the user gripping the gripping installation from intense vibrations, in order for the hand/arm vibrations acting on the user to remain below permissible critical values.

The power accumulator and the fan installation can be attached to the gripping installation, or be supported by the gripping installation, respectively. Since the gripping installation can be vibration-decoupled, as set forth above, the power accumulator and the fan installation in this instance are also exposed to only minor vibrations, this increasing the service life of said power accumulator and said fan installation, or not requiring any further vibration-decoupling measures, respectively. Conversely, the higher mass on the gripping installation, caused by the power accumulator and the fan, also contributes toward an improved reduction of vibrations on the handlebar.

The inverter installation can be disposed on the gripping installation. This means that the inverter, in addition to the power accumulator and to the fan, can likewise be supported by the handlebar.

A cover can be provided on the gripping installation, wherein the power accumulator and/or the fan installation and/or the inverter installation can be disposed below the cover. The cover serves as protection, in particular for the power accumulator and the inverter. Moreover, suitable air-guiding ducts for guiding the cooling air conveyed by the fan installation to the components to be cooled can be configured in the cover.

The work machine can be a ground compacting device. In particular, the work machine can be a tamping device or a vibratory plate compactor for compacting the ground.

The work machine can in particular have an upper mass and a lower mass which is movable relative to the upper mass.

An air-guiding installation can be provided on the upper mass, wherein the cooling airflow is at least partially guided through the air-guiding installation, and wherein the air-guiding installation supports the inverter installation.

In this case, the air-guiding installation has at least two functions, specifically that of guiding the cooling airflow and that of supporting the inverter. Moreover, it is optionally possible for the air-guiding installation to also support and guide the fan installation and/or supply lines or electrical cables, respectively, which have to be guided to the inverter installation, for example. In this way, the air-guiding installation can be configured as a multi-function part.

For example, the air-guiding installation as a unit can be fastenable to the upper mass so that the air-guiding installation including the components supported thereby can be conjointly fastened to the upper mass.

The cooling airflow here can be at least partially guided through the air-guiding installation. However, said cooling airflow can also flow into other regions, or through other regions, of the work machine, respectively.

A vibration-decoupling installation can be provided between the air-guiding installation and the upper mass. In this way, the air-guiding installation including the fan installation (if present) and the inverter installation can be fastened to the upper mass so as to be vibration-decoupled from the remaining upper mass. Rubber blocks or foam cushions are suitable as a vibration-decoupling installation, for example.

The power accumulator can be held in a storage battery receptacle, wherein the storage battery receptacle and the air-guiding installation can be coupled to one another, and wherein the storage battery receptacle and the air-guiding installation conjointly can be fastened to the upper mass so as to be vibration-decoupled by the vibration-decoupling installation.

The power accumulator here can be held in the storage battery receptacle so as to be interchangeable, and be replaced by a fresh power accumulator, for example. The storage battery receptacle and the air-guiding installation can be fixedly connected to one another in mechanical terms.

The air-guiding installation can have a support structure and a covering installation which conjointly are able to be assembled as a unit. The support structure here can be configured for supporting the fan installation and the inverter installation, wherein the support structure and the covering installation in the assembled state form an air duct which extends at least between the fan installation and the inverter installation. Accordingly, the air duct can be utilized as the path for guiding the cooling airflow. In this way, the air-guiding installation can have two components which can be assembled so as to form a unit and can also serve as housing components for the air duct.

The support structure, conjointly with the air-guiding installation and the inverter installation, as a unit can be fastenable to the upper mass. In this way it is possible for the fan installation and the inverter installation to be mounted on the support structure, and for the support structure to then be fastened to the upper mass. This can take place also when the covering installation has already been put in place and mounted.

The air-guiding installation can have an air entry opening which is provided upstream of the fan installation and is disposed downstream of the power accumulator. Air, which prior thereto flows through the power accumulator and cools the latter in the process, can then be inducted through the fan installation by way of the air entry opening during operation. In this case it is, of course, also possible for the cooling airflow to be guided through the power accumulator, or along housing walls of the power accumulator.

The air-guiding installation can have an air exit opening which is provided downstream of the inverter installation and is directed downward. The downward-directed air exit opening here can also be directed obliquely downward such that the airflow exiting there can be guided in a targeted manner to further locations. In particular, the cooling airflow exiting at the air exit opening can be guided to further components of the work machine such as, for example, to a vibration exciter or an electric drive of the vibration exciter, as is yet to be explained later.

An opening, through which the air-guiding installation extends downward in the direction of the lower mass, can be provided in the upper mass. The preconditions for a cooling airflow to be guided also to components on the lower mass by way of the air-guiding installation can be achieved in this way.

This construction is particularly suitable for a work machine embodied as a vibrating tamper or a vibratory plate compactor, respectively.

The lower mass here can have a vibration exciter which, for generating vibrations that are able to be utilized by the ground contact plate for compacting the ground, is disposed on the ground contact plate, wherein the cooling airflow can exit by way of the air exit opening and be guided in the direction of the vibration exciter provided on the lower mass.

The air-guiding installation here, downstream of the inverter installation, can have an air duct portion for guiding the cooling airflow in the direction of the vibration exciter so as to cool the latter. A flow direction for the cooling airflow in the direction of a drive motor that drives the vibration exciter, for example of a hydraulic motor or an electric motor, can in particular be generated in the process.

A typical vibration exciter here comprises the actual exciter installation, for example having one or a plurality of imbalance shafts that support in each case one imbalance mass, as well as a drive motor for the exciter installation.

It is increasingly possible for the imbalance shaft, or the imbalance shafts, respectively, in the exciter installation are directly driven by an electric motor. The electric motor can be suitably attached to the ground contact plate, for example so as to float on screw domes, such that said electric motor on a plurality of sides, in particular also on the lower side thereof, can be cooled by the cooling airflow fed by way of the air-guiding installation. It is to be attempted here that the electric motor is cooled to the best possible extent and that, if technically possible, the cooling airflow is also guided through the interior of the motor, or the motor winding of the latter. The contour of the exciter installation, or of the motor housing of the electric motor, respectively, here can be shaped such that the best possible guiding of air by way of the motor housing, or by way of the exciter installation, respectively, results there.

The cooling device can have at least two fan installations, wherein the air flows generated by the two fan installations are able to be converged so as to form a common cooling airflow. The fan installations here can be disposed so as to be mutually parallel and generate in each case individual air flows which by way of the air-guiding installation are then converged so as to form a common cooling airflow path.

This variant makes it possible for the fan installations to be of a relatively compact and small construction, but to overall generate an effective cooling airflow.

An induction opening for the cooling airflow can be provided upstream of the power accumulator, on an upper side of the upper mass. The induction opening here can be directed so as to be substantially vertically upward. The upper side of the upper mass during the operation of the vibrating tamper will be relatively well protected against dust and dirt such that comparatively little dust is drawn into the air-guiding installation by way of the induction opening provided there. The induction opening can be additionally protected by meshes or deflection louvers, so as to minimize the ingress of dust.

Specified in this way is a work machine in which fresh ambient air is inducted at a location where the lowest content of dust in the air is to be expected. This air, serving as the cooling airflow, is then drawn into the power accumulator (storage battery) and, by the fan installation (or the plurality of fan installations) in the air-guiding installation, blown onto the inverter installation. In the process, the cross section of the air-guiding ducts in the air-guiding installation is varied such that the inverter installation is imparted an optimal cooling effect.

The air exit opening of the air-guiding installation can be situated below the upper mass. The air there can be directed directly onto the vibration exciter including the motor installed thereon, so as to achieve ideally optimal cooling also here.

In this way, the cooling device provided cools all components which are present in the work machine and generate a significant power loss during the operation. The sequence of cooling, thus the profile of the cooling airflow, here is chosen such that the component that has the lowest permissible temperature (for example the power accumulator) is the first to be cooled. In contrast, the last component in the cooling airflow can sustain the highest permissible temperature (for example the electric motor in the vibration exciter). At the same time, the air is directed such that said air can precisely dissipate the power loss of the respective component on which said air is guided past at a maximum permissible ambient temperature of, for example, 45°. This balanced and optimized cooling output makes it possible for particularly weak fans to be used, which in turn only have minor output requirements that have to be met by the power accumulator during operation.

With the aid of the invention, it is possible to improve the thermal management in a work machine so as to avoid overheating of the storage battery and also of the inverter, and to thus ensure a preservation, and thus the prolongation of the service life, of the storage battery.

As a result of the use of fans, which are mounted on the handle in front or below the inverter, for example, the cooling airflow can first be inducted by way of the storage battery and thereafter be guided by way of the inverter. The actuation of the fan independently of the operating state of the drive motor can also make possible the use in warm environments, for example in the case of intense solar radiation.

These and other features and advantages of the invention will become apparent to those skilled in the art from the following detailed description and the accompanying drawings. It should be understood, however, that the detailed description and specific examples, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

These and further advantages and features of the invention will be explained in more detail hereunder by way of examples with reference to the appended Figures in which.

DETAILED DESCRIPTION

Figure 1:
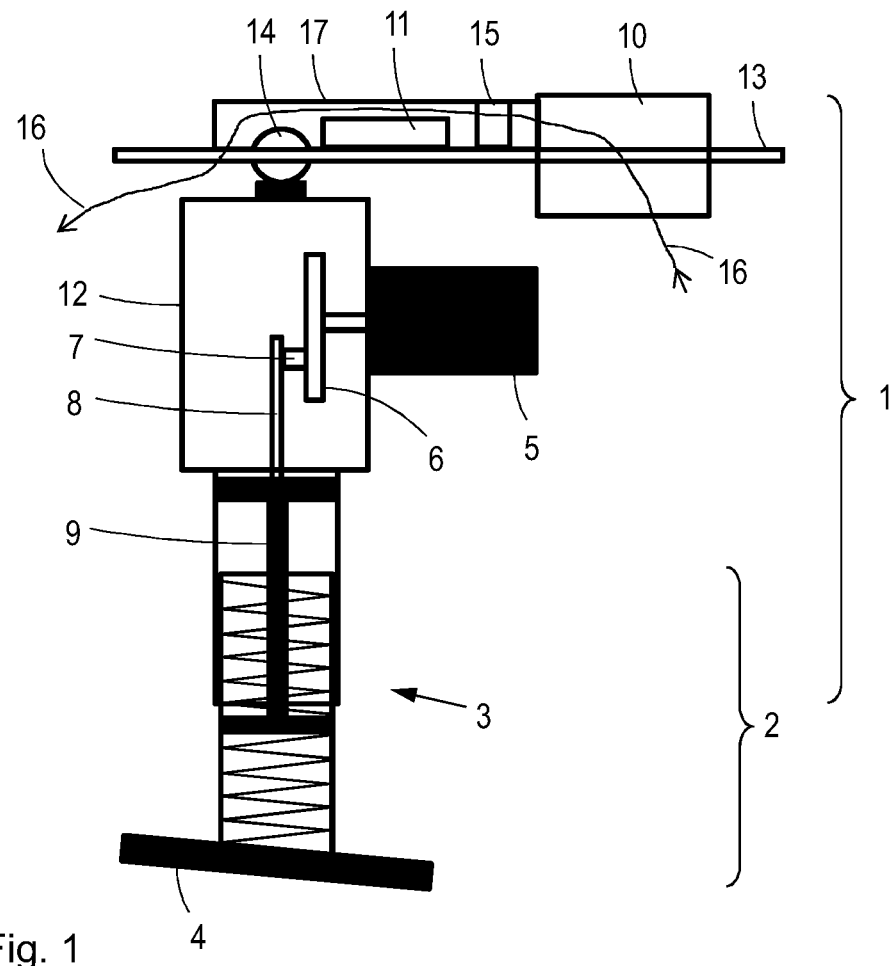
FIG. 1 in a schematic lateral sectional illustration shows a work machine according to the invention as a vibrating tamper.

FIG. 1 schematically shows a vibrating tamper, or vibratory plate compactor, respectively, having an upper mass 1 and a lower mass 2 which is movable relative to the upper mass 1. The upper mass 1 and the lower mass 2 are coupled to one another by a spring installation 3 which is known per se. A ground contact plate 4 for compacting the ground is provided on the lower side of the lower mass 2.

A drive having an electric motor 5 is provided on the upper mass 1, said electric motor 5 driving in a rotating manner a crank wheel 6 which by way of a crankpin 7 is connected to a con rod 8. The con rod 8 is connected to a tamping piston 9 such that the rotating movement of the crank wheel 6 is converted into a reciprocating movement of the tamping piston 9. The linear movement of the tamping piston 9 is then finally transmitted to the ground contact plate 4 by way of the spring installation 3, said ground contact plate 4 carrying out the actual tamping movement.

A storage battery 10, which serves as an electric power accumulator, is provided for supplying the electric motor 5 with power.

The electric current provided by the storage battery 10, in terms of the voltage and the frequency thereof, is converted or inverted, respectively, into a current suitable for the electric motor 5 by an inverter 11 serving as an inverter installation. It can be possible in particular in the process that an alternating current for the electric motor 5 is generated from the direct current stored in the storage battery 10.

The crank wheel 6, the crankpin 7 and the con rod 8 are accommodated in a crankcase 12 to which the electric motor 5 is also fastened. In one variant, the electric motor 5 can also be largely disposed in the interior of the crankcase 12.

A gripping installation 13, which is configured as a handlebar and is associated with the upper mass 1, is attached to the upper side of the crankcase 12. A vibration-decoupling installation 14, for example in the form of rubber blocks, for decoupling the gripping installation 13 from vibrations is disposed between the gripping installation 13 and the crankcase 12. As a result, the gripping installation 13 within certain limits is pivotable relative to the remaining upper mass 1, in particular relative to the crankcase 12, so as to protect an operator that grips the handlebar, or the gripping installation 13, respectively, according to the intended use at the right end in FIG. 1 from the influence of excessively intense vibrations.

The storage battery 10 as well as the inverter 11 are fastened to the gripping installation 13, or are supported by the latter, respectively. It is possible here for the storage battery 10 to be fastened in an interchangeable manner to the gripping installation 13 such that said storage battery 10 can in each case be replaced by a fresh storage battery 10.

A fan installation 15, which has a fan, for example a ventilator, and a fan motor, is disposed between the storage battery 10 and the inverter 11 in spatial terms.

The fan installation 15 generates a cooling airflow 16 in that the former inducts air by way of the storage battery 10 and forces said air downstream by way of the inverter 11 until the cooling airflow 16 makes its way back into the environment. The profile of path of the cooling airflow 16 is symbolically illustrated by an arrow in FIG. 1.

A cover 17, for example a plastic hood, is provided for improved guiding of the cooling airflow 16 as well as for the protection of the various components.

In a variant not illustrated, the fan installation 15 can also be disposed upstream of the storage battery 10 or downstream of the inverter 11, so as to suitably generate the cooling airflow 16 (cf. direction of arrow).

Figure 2:
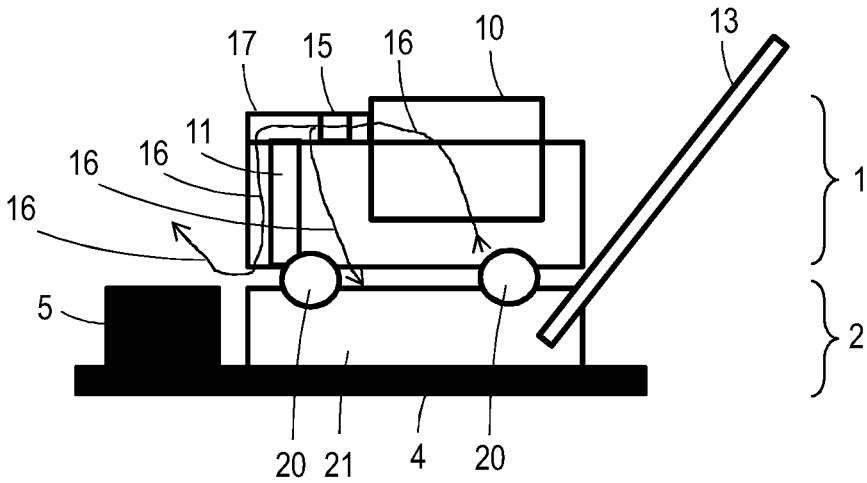
FIG. 2 in a schematic lateral view shows another work machine according to the invention as a vibratory plate compactor.

FIG. 2 shows another embodiment of the work machine as a vibratory plate compactor. Functionally equivalent or identical components are provided with the same reference signs as in the embodiment of FIG. 1.

Accordingly, the vibratory plate compactor likewise has an upper mass 1 and a lower mass 2, wherein the lower mass 2 is movable relative to the upper mass 1. To this end, vibration-decoupling elements 20 are provided between the upper mass 1 and the lower mass 2.

A ground contact plate 4 is configured on the lower mass 2. The electric motor 5, which drives a vibration exciter 21, is disposed on the ground contact plate 4. The vibration exciter 21 can have, for example, one or a plurality of imbalance shafts which are set in rotation by the electric motor 5, which serves as the drive motor, so as to generate the desired vibrations. The vibrations, by way of the ground contact plate 4, are then introduced directly into the ground to be compacted.

The storage battery 10, which provides the power for the electric motor 5, conjointly with the inverter 11 is disposed on the upper mass 1.

As in the embodiment of FIG. 1, the fan installation 15 is disposed between the storage battery 10 and the inverter 11, so as to effect the cooling airflow 16 through the storage battery 10 and along the inverter 11. As can be seen, the cooling airflow 16 downstream of the fan installation 15 can be guided in such a manner that the inverter 11 is ideally surrounded by the cooling airflow 16 on all sides, or at least on both sides, respectively. Depending on the design embodiment however, the cooling effect is also sufficient when the storage battery 10 and/or the inverter 11 are passed by a flow on only one side.

The cover 17 is provided for improved guiding of the cooling airflow 16.

The gripping installation 13 in the case of the vibratory plate compactor is configured in the form of a drawbar which is able to be guided by an operator and is fastened to the lower mass 2.

Figure 3:
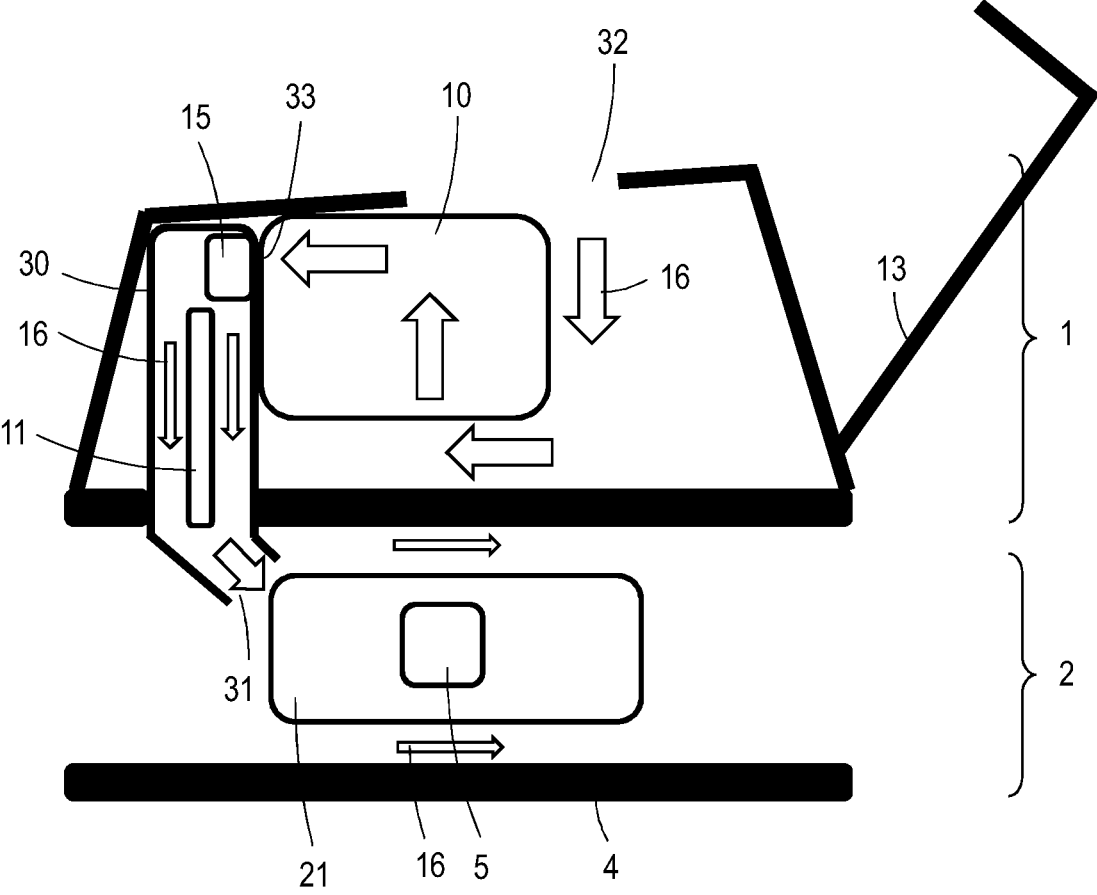
FIG. 3 shows a variant of a vibratory plate compactor having an air-guiding installation.

FIG. 3 in a schematic lateral view shows a variant of the vibratory plate compactor of FIG. 2.

The vibratory plate compactor likewise has an upper mass 1 and a lower mass 2. The ground contact plate 4, to which the vibration exciter 21 is attached, is provided on the lower mass 2. The vibration exciter 21 not only comprises the actual exciter unit but also the electric motor 5 integrated therein.

The storage battery 10, as well as an air-guiding installation 30, are provided on the upper mass 1.

The air-guiding installation 30 is a compact unit which, by way of a vertical component, extends perpendicularly. The fan installation 15 for generating the cooling airflow 16 is provided in the air-guiding installation 30. The cooling airflow 16 is symbolized by a plurality of arrows of dissimilar sizes in FIG. 3, wherein the reference sign 16 is not applied to each arrow, so as not to compromise the clarity of the illustration.

Furthermore, the inverter 11 is held in the air-guiding installation 30. The inverter 11 is disposed so as to be substantially perpendicular and is on both sides impacted by the cooling airflow 16.

The air-guiding installation 30, at the lower end thereof, penetrates the upper mass 1 in a downward direction, such that the cooling airflow 16 can be discharged by way of an air exit opening 31.

As can be seen in FIG. 3, the cooling airflow 16 here is deflected in the direction of the vibration exciter 21 and of the electric motor 5 such that said cooling airflow 16 can still be utilized for cooling at that location.

The vibration exciter 21, or the electric motor 5, respectively, are mounted on the ground contact plate 4 in such a manner that said vibration exciter 21 or said electric motor 5 can be surrounded in the best possible manner by the cooling airflow 16. It can be provided in particular that the cooling airflow 16 can also flow below the electric motor 5, between the electric motor 5 and the ground contact plate 4, so as to improve the cooling effect.

An induction opening 32, by way of which cooling air can flow in from the environment, is configured on the upstream end, on the upper side of the upper mass 1. The disposal of the induction opening 32 on the upper side makes it possible that the cooling air enters the upper mass 1 ideally free of dust and dirt.

The cooling airflow 16 is subsequently guided along the walls of the storage battery 10, or through the storage battery 10, respectively.

The fan installation 15, which generates the cooling airflow 16, is disposed in the upper region of the air-guiding installation 30. An air entry opening 33, by way of which the cooling airflow 16 can enter the air-guiding installation 30 once said cooling airflow 16 has been transported by the fan installation 15, is provided upstream of the fan installation 15 and downstream of the storage battery 10.

Figure 4:
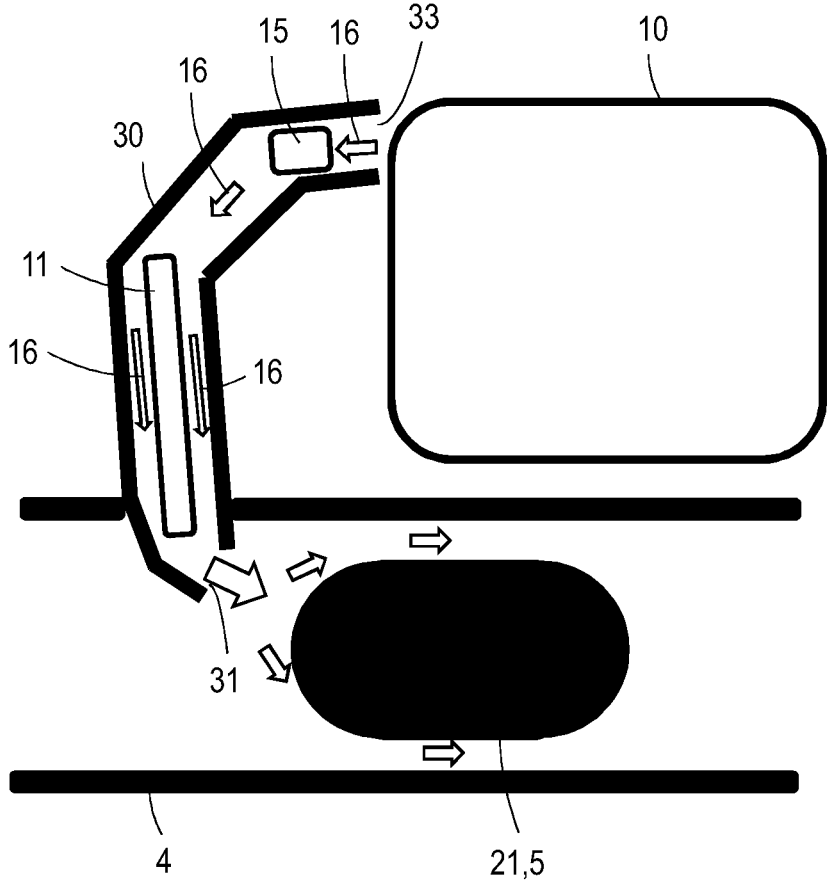
FIG. 4 shows a detail pertaining to the variant of FIG. 3.

FIG. 4 shows the context of FIG. 3 in an enlarged but reduced illustration.

The air-guiding installation 30 here is configured so as to be arcuate in order for the cooling airflow 16 to be guided expediently along the inverter installation 11.

It can also be seen here how the cooling airflow 16, upon exiting the air-guiding installation 30, is divided by way of the air exit opening 31 so as to provide a flow surrounding the vibration exciter 21 including the electric motor 5.

The invention claimed is:

1. A work machine comprising:
a work device for effecting an operative movement; and
a drive for driving the work device, wherein
the drive has an electric drive motor, an electric power accumulator for supplying the drive motor with an electric current, and an inverter installation for inverting the current from the power accumulator and for feeding the current to the drive motor;
a cooling device for cooling the power accumulator and the inverter installation;
wherein the cooling device has at least one fan installation for generating a cooling airflow for cooling the power accumulator and the inverter installation, wherein
the fan installation has a fan and a fan motor that drives the fan, wherein
the fan motor is provided separately from the drive motor of the drive, and wherein
the cooling airflow is guided in a cooling airflow path extending between the power accumulator and the inverter installation.

2. The work machine as claimed in claim 1, wherein
the cooling device has at least two fan installations; and wherein
the airflows generated by the fan installations are able to be converged so as to form at least a portion of the cooling airflow path.

3. The work machine as claimed in claim 1, wherein the fan is disposed in the cooling airflow path between the power accumulator and the inverter installation.

4. The work machine as claimed in claim 1, wherein
the work machine includes an upper mass and a lower mass; wherein
the lower mass is movable relative to the upper mass; wherein
the power accumulator, the inverter installation and the cooling device are disposed on the upper mass; and wherein
a ground contact plate for carrying out an operative movement of the work machine is disposed on the lower mass.

5. The work machine as claimed in claim 4, wherein the work machine is a vibrating tamper or a vibratory plate machine.

6. The work machine as claimed in claim 4, wherein an air-guiding installation is provided on the upper mass and defines, at least in part, the cooling airflow path;

the cooling airflow is at least partially guided through the air-guiding installation; and wherein the air-guiding installation supports the inverter installation.

7. The work machine as claimed in claim 6, wherein a vibration-decoupling installation is provided between the air-guiding installation and the upper mass.

8. The work machine as claimed in claim 6, wherein the power accumulator is held in a storage battery receptacle;

the storage battery receptacle and the air-guiding installation are coupled to one another; and wherein the storage battery receptacle and the air-guiding installation are conjointly fastened in a vibration-decoupled manner to the upper mass by way of the vibration-decoupling installation.

9. The work machine as claimed in claim 6, wherein the air-guiding installation has a support structure and a covering installation which are able to be conjointly assembled so as to form a unit;

the support structure is configured to support the fan installation and the inverter installation; and wherein the unit formed by the support structure and the covering installation forms an air duct which extends at least between the fan installation and the inverter installation.

10. The work machine as claimed in claim 9, wherein the support structure, conjointly with the fan installation and the inverter installation, are fastened as a unit to the upper mass as a unit.

11. The work machine as claimed in claim 6, wherein the air-guiding installation has an air entry opening which is provided upstream of the fan installation and which is disposed downstream of the power accumulator.

12. The work machine as claimed claim 6, wherein the air-guiding installation has an air exit opening which is provided downstream of the inverter installation and which is directed downward.

13. The work machine as claimed in claim 6, wherein an opening, through which the air-guiding installation extends downward in the direction of the lower mass, is provided in the upper mass.

14. The work machine as claimed in claim 6 wherein the lower mass has a vibration exciter which is disposed on the ground contact plate and which is configured to generate vibrations that are able to be utilized by the ground contact plate; and wherein the cooling airflow path is configured such that the cooling airflow exits the air guiding installation by way of the air exit opening and is guided in the direction of the vibration exciter on the lower mass.

15. The work machine as claimed in claim 6, wherein an induction opening for the cooling airflow installation is provided upstream of the power accumulator, on an upper side of the upper mass.

* * * * *